United States Patent
Amaducci et al.

(10) Patent No.: US 11,855,600 B2
(45) Date of Patent: Dec. 26, 2023

(54) HIGH FREQUENCY, HIGH OUTPUT IMPEDANCE AMPLIFIER FOR EMI ACTIVE FILTER APPLICATIONS

(71) Applicant: Schaffner EMV AG, Luterbach (CH)

(72) Inventors: Alessandro Amaducci, Deitingen (CH); Enrico Mazzola, Gerlafingen (CH)

(73) Assignee: SCHAFFNER EMV AG, Luterbach (CH)

(*) Notice: Subject to any disclaimer, the term of this patent is extended or adjusted under 35 U.S.C. 154(b) by 0 days.

(21) Appl. No.: 17/720,879

(22) Filed: Apr. 14, 2022

(65) Prior Publication Data

US 2022/0337226 A1  Oct. 20, 2022

(30) Foreign Application Priority Data

Apr. 14, 2021 (EP) .................................... 21168429

(51) Int. Cl.
*H03H 11/04* (2006.01)
*B60R 16/02* (2006.01)
*H03F 3/19* (2006.01)

(52) U.S. Cl.
CPC ............. *H03H 11/04* (2013.01); *B60R 16/02* (2013.01); *H03F 3/19* (2013.01); *H03F 2200/451* (2013.01)

(58) Field of Classification Search
CPC ....... H03H 11/04; H03H 1/0007; B60R 16/02; H03F 3/19; H03F 2200/451; H03F 2200/114; H03F 3/3069; H03F 3/45475; H03F 2200/462; H03F 2200/481; H03F 2200/498; H03F 1/302; H02M 1/44; B60L 2270/147
See application file for complete search history.

(56) References Cited

U.S. PATENT DOCUMENTS

| 8,823,448 | B1* | 9/2014 | Shen ................. H04B 15/00 327/552 |
| 2014/0043871 | A1 | 2/2014 | Shen et al. |
| 2018/0269781 | A1 | 9/2018 | Amaducci |

* cited by examiner

*Primary Examiner* — Jung Kim
(74) *Attorney, Agent, or Firm* — Blank Rome LLP

(57) ABSTRACT

A high-frequency amplifier for an active EMI filter with a symmetric class B emitter-follower output stage driven by a driver stage, with a sense output resistor. Both terminals of the sense resistor are brought to the noninverting, respecting inverting input of the driver stage through two dividers of the same ratio, in a global voltage feedback loop. The amplifier is configured to provide a high output impedance at 10 kHz and up to 100 MHz, a peak-to-peak output current of 2-10 ampere and a low quiescent current of less than 400 mA. The invention includes EMI filters with such a high-frequency current source, for example in the current-sense current-inject feedback configuration.

12 Claims, 2 Drawing Sheets

HIGH FREQUENCY, HIGH OUTPUT IMPEDANCE AMPLIFIER FOR EMI ACTIVE FILTER APPLICATIONS

REFERENCE DATA

The present application claims priority of European patent application EP21168429 of Mar. 14, 2021. The entire content of this application is incorporated herein by reference.

TECHNICAL DOMAIN

The present invention concerns an electromagnetic compatibility filter for suppressing an unwanted noise component superimposed on an electric supply line. Embodiments of the invention concern a filter placed behind a motor drive unit on a DC power bus, in an electric vehicle, although this is not the only application of the invention.

RELATED ART

Electric systems in vehicles and in industry are becoming ever more complex and include a multitude of components that generate, or are liable to be disturbed by, electromagnetic interferences. Electric motors, for example, are often driven by electronic inverters that control the motor speed and torque by generating waveforms with variable frequency and amplitude. These systems provide high efficiency but generate a powerful electromagnetic noise.

Switching power converters are used in electric and hybrid vehicles, as well as in countless other applications such as driving stationary motors, battery chargers, photovoltaic systems, lighting control, computers, and other. In all these cases, the switching action of the converter is a source of electromagnetic noise that could, if it is not managed or attenuated, affect the functioning of other systems, or exceed normative limits.

Electric or electronic filters used to attenuate these unwanted interferences, called EMI filters in short, are used in all branches of electric engineering to improve reliability and respect existing norms. Well-designed filtering system are essential to the performance of many complex electric systems.

Electric and hybrid vehicles are equipped with different power converters in a very tight space. This coexistence represents a serious electromagnetic problem and demands efficient EMI filtering. When the filters are not enough to bring the noise to acceptable levels, shielded cables can be used, but they contribute significantly to costs.

It is known to use passive low-pass LC filters to attenuate EMI. While passive solutions do offer substantial attenuation, they have their limits. Magnetic components rated for the current levels used in modern electric vehicles are bulky, expensive, heavy, and not always suitable for mass production.

Document US20180269781 discloses an active EMI filter for an electric vehicle. Active filters can be more compact than equivalent passive ones but providing a satisfactory active filter for the high-current wide-bandwidth interferences generated in electric vehicles is difficult.

Active filters are known in many variants and topologies. They generally include an output stage that must be fast enough to cancel noise in the desired band of frequency, have a dynamic matching the noise level, and adequate input and output impedances. Applications in the automotive fields pose unprecedented requirements in terms of speed and output current that are hard to satisfy with known architectures.

Active filters rely necessarily on an auxiliary power supply. In some cases, the auxiliary power supply must be bipolar, which may not be economically available.

The stopband (the interval of frequency in which the attenuation is sensible) of an active EMI filter will be chosen according to the need. In most applications, including in vehicles, it is expected that an EMI filter should be effective in a band of frequencies between 1 kHz and some tens of MHz, possibly up to 100 MHz or above. In the following, this interval of frequency may be indicated conventionally as "HF" or "high frequency", while the part of spectrum between below this interval and down to 0 may be conventionally indicated as "DC".

SHORT DISCLOSURE OF THE INVENTION

An aim of the present invention is the provision of a filter that overcomes the shortcomings and limitations of the state of the art.

According to the invention, these aims are attained by the object of the attached claims, and especially by a high-frequency amplifier for an active EMI filter with a symmetric emitter-follower output stage with two bipolar transistors in a symmetric complementary pair configuration, an input stage driving the output stage, a sense resistor through which the output current flows, a voltage feedback loop for feeding back a voltage measured across the sense resistor to the input stage. In a preferred configuration, which however is not the only one, the voltage feedback loop is configured for feeding back the potentials at both ends of the sense resistor to an inverting input of the input stage respectively a noninverting input of the input stage, preferably through two resistive dividers of the same ratio.

The high-frequency amplifier is configured for operation in B (or AB) class, thanks to a comprising a voltage reference defining a potential difference between the bases of the bipolar transistors. Preferably the voltage reference has a negative temperature coefficient for thermal stability and could be realized, among other possibilities, with a Vbe multiplier. Although the amplifier can deliver high currents of 1 A peak-to-peak or up to 10 A, its quiescent current is moderate, typically less than 400 mA. The temperature operating range extends at least between −40° C. and 125° C. and is adequate for automotive applications.

The high-frequency amplifier can operate on a unipolar power supply and has a high output impedance (it approximates a current source). Typically, the output impedance is more than 1 kOhm at 100 kHz. Moreover, the amplifier of the invention has a flat bandwidth (within 3 dB) in the frequency range between 10 kHz and 10 MHz, extendable to 100 MHz with a careful design and choice of components.

Thanks to the above characteristics, the amplifier of the invention is an excellent choice for building active filters, particularly of the "current injecting" topology. The filter stopband is directly determined by the bandwidth of the amplifier and covers most of the switching noise generated by variable-frequencies motor drives found in electric or hybrid vehicles. Higher frequencies, if present, can be effectively attenuated by small passive filters. The filters are preferably configured to attenuate common-mode noise, and the sensing of the noise current circulating in the power line can be obtained by a common-mode current transformer.

The invention also relates to the use of the above active EMI filter on the power bus of an electric or hybrid vehicle.

SHORT DESCRIPTION OF THE DRAWINGS

Exemplar embodiments of the invention are disclosed in the description and illustrated by the drawings in which.

EXAMPLES OF EMBODIMENTS OF THE PRESENT INVENTION

Figure 1:
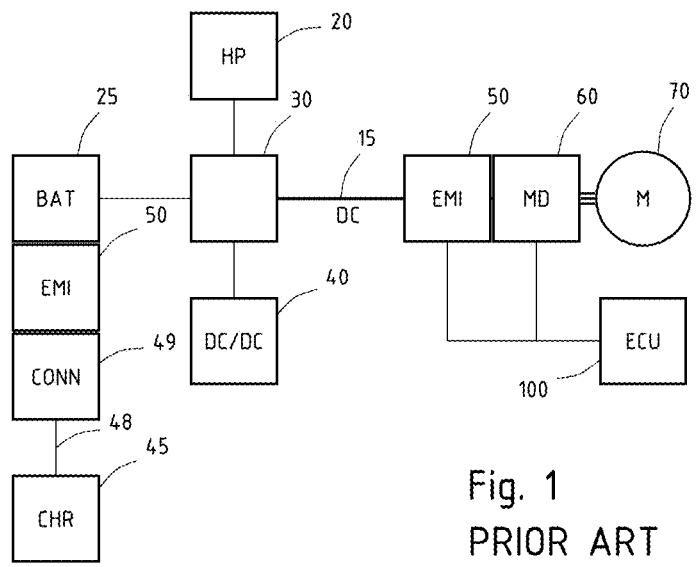
FIG. 1 illustrates schematically a possible structure of an electric vehicle in which the filter of the invention can be employed.

FIG. 1 shows in a very simplified fashion the main components of an electric vehicle. The energy necessary to the traction is stored in a battery pack 45 and may be replenished by the charger 45 or—in the case of a hybrid vehicle—by a non-illustrated combustion motor. The battery pack 25 is connected to a power distribution unit 30 that distributes the power to various loads, for instance an DC/DC converter 40 for generating a 12V voltage for auxiliary equipment (entertainment, lights, on-board computers, etc.), and heat pumps 20 for the heating/ear conditioning. Importantly, a high-voltage DC bus 15 transmits the voltage of the battery to a motor drive unit 60 that includes an inverter generating multiphase AC waveforms suitable for the electric traction motor 70. An EMI filter 50 is inserted on the DC bus 15 at the supply point of the drive unit 60 to filter out the noise generated by the inverter in the latter.

The configuration of FIG. 1 is just one among the various possibilities and is provided merely as a non-limiting example of one possible use of the invention. The invention may be used in electric vehicles presenting various configurations, for example in series-hybrid, parallel-hybrid, plug-in-hybrid configurations that do not correspond to the diagram of FIG. 1. The invention is not limited to automotive applications, either.

FIG. 1 shows two EMI filters 50, one between battery 25 and charging connector 49, and one on the DC side of the motor drive 60. The inventive EMI filter may be used in other positions without leaving the scope of the invention. Meaningful locations for EMI filters are: before and after the charger 45; after the battery 25; before the DC/DC converter 40. The charging unit 45 may be totally or in part installed after the connector 49. All these variants are included in the scope of the invention defined by the appended claims.

Figure 2:
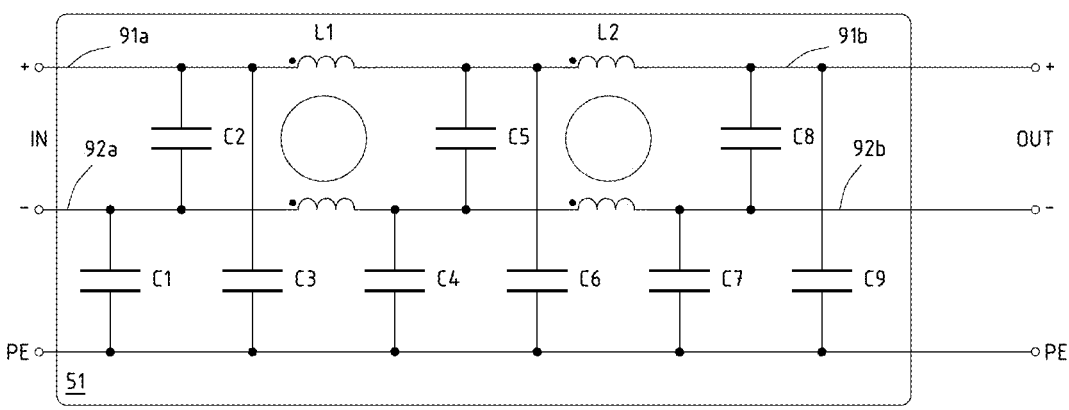
FIG. 2 shows a conventional passive EMI filter.

FIG. 2 shows a possible structure of a passive EMI filter 51 as known in the art. The filter is configured as a two-stage LC filter with two common-mode chokes L1 and L2 and several capacitors connected between the positive and negative power rails (X-capacitors C2, C5, C8) or between a power rail and the protective earth conductor (Y-capacitors C1, C3, C4, C6, C7, C9). Such filters can be designed to provide an effective attenuation of noise at the price of an increase in size, weight, and manufacturing cost.

According to the needs, an EMC filter can be designed to attenuate differential and/or common mode noise. Common mode noise appears simultaneously with the same polarity on all the conductors of the supply bus and is often dominant. The filter of FIG. 2 is designed to attenuate primarily common-mode noise.

Figure 3:
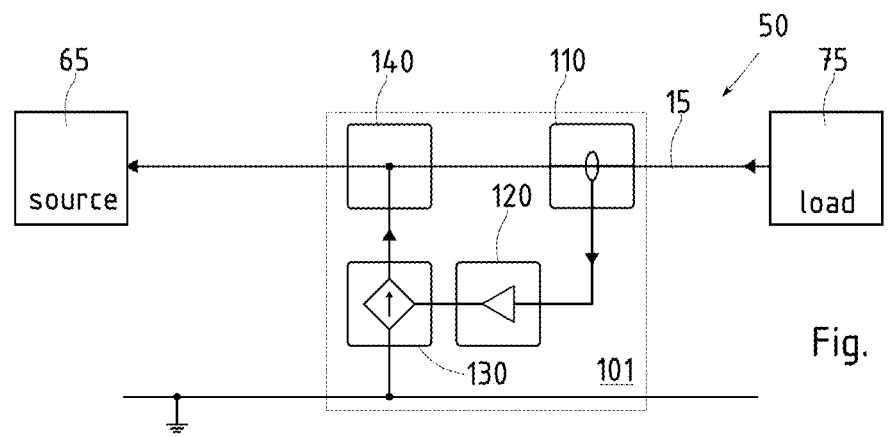
FIGS. 3 to 5 illustrate schematically a filter according to the invention.

FIG. 3 illustrates a possible structure of a filter 50 according to the invention. It is drawn as a unifilar scheme, and power line 15 is represented by a single line. This is a simplification of a real implementation in which the power line 15 may include several conductors. In an important, but not exclusive, implementation, the supply line 15 may be a HVDC bus in an electric vehicle comprising a positive rail and a negative rail. The filter may be designed to attenuate a differential noise or, preferably, a common-mode noise component.

In the illustrated embodiment, the active filter has a feedback configuration with a current sense unit 110, which could be a current transformer, that reads the noise current flowing out of the output, as an error signal, an analogue signal conditioning stage 120 that is designed to amplify the error signal in a determined frequency band, a current source 130 that injects, through the current injection circuit 140, a correction current on the supply line 15.

The filter presented has a "current sensing/current injecting" topology that sense a current and inject a corresponding correction current. The invention is not limited to this case, however, and may also include filters that sense the noise as a voltage disturbance of the supply line, and/or include a voltage source to inject a voltage on the supply line, or filters with an output circuit that is neither a pure current source nor a pure voltage source. The following description will introduce "current sense units" at the input of the filters, and "current sources" at the output but, they could be replaced by voltage sensors, respectively voltage sources, or by sensor and sources that are neither pure current nor pure voltage type, without leaving the scope of the invention.

As it is known an ideal feedback filter provides, in closed loop, an attenuation that is given by $Y=X/(1+H)$ where Y denotes the signal at the filter's output, X the signal at the input, and H is the open-loop gain. In reality, additional factors will be introduced by non-ideal behaviour of the sensor and of the electronic circuit chain. The invention, however, is not limited to this topology of filter and may also include, for example, feed-forward filters.

Any active filter exhibits a dynamics limit, that is the maximum current that can be injected back on the supply line and rely on a power supply (not represented) for their work. Its performance is guaranteed into a determined bandwidth, where their operating parameters (for example the insertion loss) respect nominal values. The bandwidth of the filtering stages will be determined in consideration of the noise bandwidth. The amplifier of the invention can operate in an extended bandwidth, for example between 10 kHz and 10 MHz or up to 100 MHz with an essentially constant gain (within 3 dB).

The active filter is inserted on the supply line after the noise source (eventually with a passive pre-filtering stage) and should be capable of injecting a current having the same intensity as the noise current. Demanding applications may have noise amplitudes of 2 A peak-to-peak or more, up to 10 A peak-to-peak, and the output dynamics of the first active filtering stage should match these figures.

Figure 4:
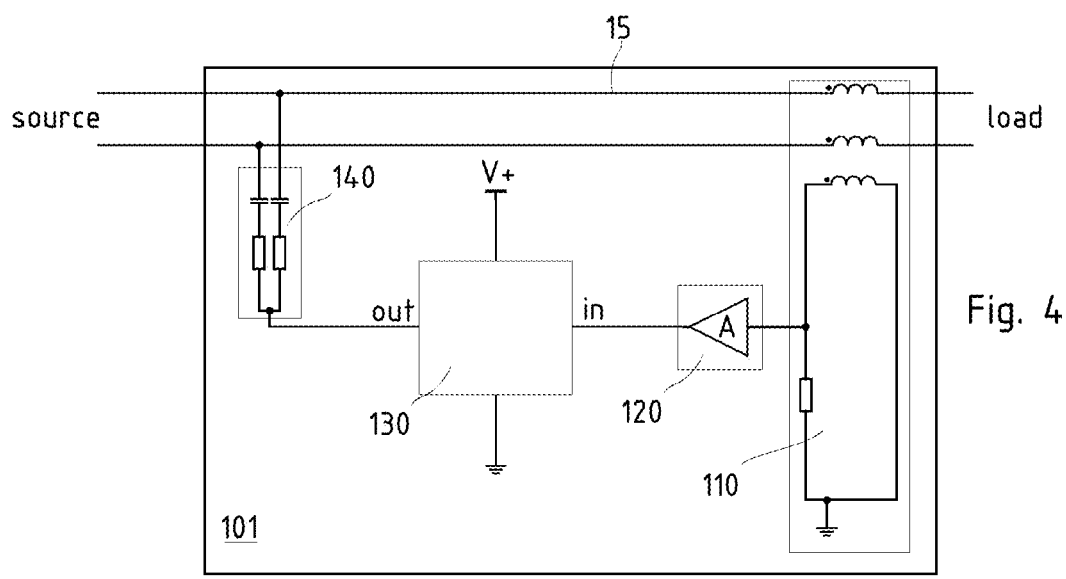
Figure 5:
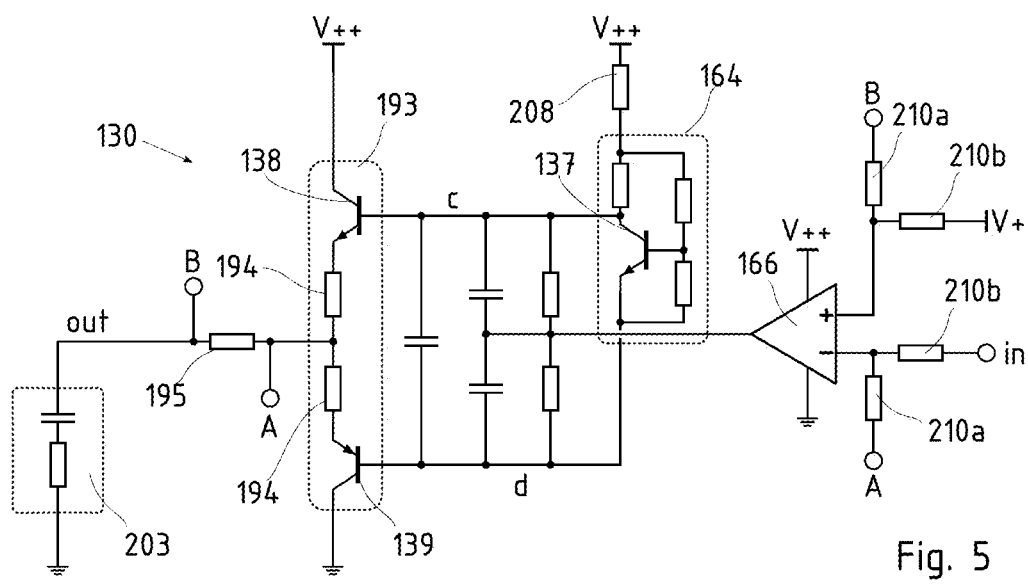

The required dynamic behaviour can be obtained by a filter configured as shown in FIGS. 4 and 5. In this configuration the common-mode noise signal sensed by current transformer 110 is amplified by a gain stage 120 and then presented to the input of an amplifier 130 that is configured to deliver an output current proportional to its input voltage. The current is then injected into the power line through the passive decoupling network 140. It is important for the good performance of the filter that the amplifier 130 approximates an ideal current source with a high output impedance or, at least, an output impedance that exceeds significantly the equivalent impedance of the supply line 15.

The amplifier 130 is shown in the simplified schematic of FIG. 5. It has two bipolar transistors in a symmetric emitter-follower configuration: a PNP transistor 138 with a collector connected to a positive supply voltage V++ and a NPN transistor 139 with a collector connected to the ground, or another suitable constant supply below V++. The emitters of the transistors are connected through with two emitter resistors 194. A sense resistor is between the common point of the emitter resistors 194 and the output of the amplifier.

The bases of both transistors are shifted from one another by the voltage reference 164 that maintains a constant voltage between the nodes 'd' and 'c' linked to the transistor's bases. It is stressed that this is only one example between many possible arrangements for determining a suitable operating point of transistors 138 and 139.

The stage may be configured to operate in class B, the PNP transistor being active only for the negative polarity of the output current and the NPN transistor for the positive one, or possibly in class AB with a small region of class-A operation around the centre point.

The voltage reference 164 preferably has negative temperature coefficient matching that of the Vbe of transistors 138 and 139. This can be obtained, for example, by a Vbe multiplier circuit as drawn. The voltage difference between nodes 'd' and 'c' is essentially constant against variations of the current flowing from resistor 208 and has the desired temperature coefficient. Without this arrangement, the quiescent current flowing through transistors 138, 139 would increase with the temperature. Other voltage sources could be used in lieu of the Vbe multiplier 164.

The amplifier 130 generates an output current proportional to its input voltage that flows through the sense resistor 195 into the load, represented in simplified form by network 203. Both terminals of the sense resistor 195 are connected to the input of the driver stage 166 in a voltage feedback loop. Terminal A is connected to the inverting input of operational amplifier 166 and terminal B is connected to the non-inverting input of the same. Two wires connecting points A-A and B-B have been omitted to avoid cluttering. Resistors 210a and 210b form two resistive dividers, preferably having the same ratio.

The inventors have found that this configuration can provide, thanks to the feedback a high output impedance, which is desirable in an active EMI filter.

The combination of emitter-follower symmetric stage 193, active gain stage 166, sense resistor 195 and voltage feedback provides a voltage controlled high frequency amplifier whose output approximates a current source, that has been found very suitable for the realization of active EMI filters in different industrial fields, especially for automotive applications. This system is more complex than other known HF sources but the complexity is rewarded with many important advantages, including:

- high output impedance in large frequency range, for example 2 kΩ at 100 kHz (value dependent on the component's choice).
- Stable operating point over an extended temperature range, for example between −40° C. and 125° C.
- Single supply
- High current capability, up to 10 A peak-to-peak
- low quiescent current, typically less than 400 mA.

REFERENCE SYMBOLS IN THE FIGURES 15 supply line, DC bus
20 heat pump
25 battery pack
30 power distribution unit
40 DC/DC converter
45 charger
48 charge line
49 connector
50 EMC filter
51 passive filter
60 motor drive unit
65 noise source
70 motor
75 load, victim device
100 ECU
101 active filter stage (power stage)
110 current sense, current transformer
120 preamplifier, signal conditioning
130 current amplifier
137 NPN transistor
138 NPN transistor
139 PNP transistor
140 current injection
164 voltage reference, Vbe multiplier
166 gain stage
193 complementary pair
194 emitter resistors
195 sense resistor
203 supply line equivalent impedance
208 resistor

The invention claimed is:

1. A high-frequency amplifier for an active EMI filter comprising a symmetric emitter-follower output stage for providing an output current with two bipolar transistors in a symmetric complementary pair configuration, an input stage driving the output stage, a sense resistor through which the output current flows, a voltage feedback loop for feeding back a voltage measured across the sense resistor to the input stage, wherein the high-frequency amplifier comprises a voltage reference defining a potential difference between bases of the bipolar transistors, wherein the voltage reference has a negative temperature coefficient.

2. The high-frequency amplifier of claim 1, wherein the voltage feedback loop is configured for feeding back potentials at both ends of the sense resistor to an inverting input and a noninverting input of the input stage, respectively.

3. The high-frequency amplifier of claim 1, wherein the voltage reference is a Vbe multiplier.

4. The high-frequency amplifier of claim 1, wherein the voltage reference is configured for operation in class B or AB, and a quiescent current of the high-frequency amplifier is less than 400 mA.

5. The high-frequency amplifier of claim 1, having a unipolar power supply.

6. The high-frequency amplifier of claim 1, having an output dynamic range between 1 A peak-to-peak and 10 A peak-to-peak a bandwidth of at least 10 MHz, or a bandwidth in the interval 10 kHz-100 MHz, and an output impedance of at least 1000 Ohm at 100 kHz.

7. The high-frequency amplifier of claim 1, having a temperature operating range extending at least between −40° C. and 125° C.

8. An active EMI filter comprising a sense unit configured to sense a noise signal circulating in a power line from a noise source to a load, a high-frequency amplifier comprising a symmetric emitter-follower output stage for providing an output current with two bipolar transistors in a symmetric complementary pair configuration, an input stage driving the output stage, a sense resistor through which the output current flows, a voltage feedback loop for feeding back a voltage measured across the sense resistor to the input stage, the high-frequency amplifier is driven by the noise signal generating an output current, and a current-inject unit injecting the output current into the power line, wherein the sense unit is a current transformer coupling to a noise current on the power line.

9. The active EMI filter of claim 8, comprising a sense unit configured to sense a noise signal circulating in a power line from a noise source to a load, control the high-frequency current source according to the noise signal, inject the high-frequency output current of the high-frequency current source into the power line through a current-inject unit.

10. The active EMI filter of claim 9, wherein the noise signal is common-mode.

11. Use of the active EMI filter of claim 8 on a power bus of an electric or hybrid vehicle.

12. An active EMI filter comprising a sense unit configured to sense a noise signal circulating in a power line from a noise source to a load, the high-frequency amplifier of claim 1, driven by the noise signal generating an output current, and a current-inject unit injecting the output current into the power line.

* * * * *